United States Patent

Lee et al.

[11] Patent Number: 5,869,902
[45] Date of Patent: *Feb. 9, 1999

[54] SEMICONDUCTOR DEVICE AND MANUFACTURING METHOD THEREOF

[75] Inventors: Sang-in Lee; Chang-soo Park, both of Kyungki-do, Rep. of Korea

[73] Assignee: Samsung Electronics Co., Ltd., Kyungki-Do, Rep. of Korea

[*] Notice: The term of this patent shall not extend beyond the expiration date of Pat. No. 5,355,020.

[21] Appl. No.: 612,792

[22] Filed: Mar. 11, 1996

Related U.S. Application Data

[60] Division of Ser. No. 8,775, Jan. 25, 1993, Pat. No. 5,534,463, which is a continuation-in-part of Ser. No. 897,294, May 11, 1992, Pat. No. 5,318,923, which is a continuation-in-part of Ser. No. 585,218, Sep. 19, 1990, abandoned.

[30] Foreign Application Priority Data

Jan. 23, 1992 [KR] Rep. of Korea .......................... 92-904

[51] Int. Cl.$^6$ .......................... H01L 23/48; H01L 23/52; H01L 29/40
[52] U.S. Cl. .......................... 257/773; 257/751; 257/752; 257/758; 257/763; 257/764; 257/765; 257/767; 257/770; 257/774; 257/775
[58] Field of Search ...................... 257/751, 752, 257/758, 763, 764, 765, 767, 770, 771, 774, 775

[56] References Cited

U.S. PATENT DOCUMENTS

| | | | |
|---|---|---|---|
| 4,589,196 | 5/1986 | Anderson | 148/DIG. 20 |
| 4,630,357 | 12/1986 | Rogers et al. | 437/195 |
| 4,641,420 | 2/1987 | Lee . | |
| 4,720,908 | 1/1988 | Wills | 437/192 |
| 4,963,511 | 10/1990 | Smith | 437/192 |
| 4,970,176 | 11/1990 | Tracy et al. | 437/187 |
| 4,983,547 | 1/1991 | Arima et al. | 437/246 |

(List continued on next page.)

FOREIGN PATENT DOCUMENTS

| | | | |
|---|---|---|---|
| 61-183942 | 8/1986 | Japan . | |
| 62-109341 | 5/1987 | Japan . | |
| 62-132348 | 6/1987 | Japan . | |
| 62-211915 | 9/1987 | Japan . | |
| 62-274640 | 11/1987 | Japan | 437/195 |

(List continued on next page.)

OTHER PUBLICATIONS

W.Y-C Lai, et al., "CVD Aluminum for Submicro-VLSI Metallization" 1991 Proc. 8th International Conference (Jun. 11–12, 1991) pp. 89–95.

Hisako Ono et al., "Development of a Planarzdie Al-Si Contact Filling Technology", VMIC Conference, Jun. 12, 1990, pp. 76–82.

(List continued on next page.)

*Primary Examiner*—Mahshid D. Saadat
*Assistant Examiner*—Jhihan B. Clark
*Attorney, Agent, or Firm*—Pillsbury Madison & Sutro LLP

[57] ABSTRACT

A wiring layer of a semiconductor device having a novel contact structure is disclosed. The semiconductor device includes a semiconductor substrate, an insulating layer having an opening (contact hole or via), a reactive spacer formed on the sidewall of the opening or a reactive layer formed on the sidewall and on the bottom surface of the opening and a first conductive layer formed on the insulating layer which completely fills the opening. Since the reactive spacer or layer is formed on the sidewall of the opening, when the first conductive layer material is deposited, large islands will form to become large grains of the sputtered Al film. Also, providing the reactive spacer or layer improves the reflow of the first conductive layer during a heat-treating step for filling the opening at a high temperature below a melting temperature. Thus, complete filling of the opening with sputtered Al can be ensured. All the contact holes, being less than 1 μm in size and having an aspect ratio greater than 1.0, can be completely filled with Al, to thereby enhance the reliability of the wiring of a semiconductor device.

38 Claims, 9 Drawing Sheets

U.S. PATENT DOCUMENTS

| | | | |
|---|---|---|---|
| 5,071,791 | 12/1991 | Inoue et al. | 437/203 |
| 5,213,989 | 5/1993 | Fitch et al. | 437/203 |
| 5,266,521 | 11/1993 | Lee et al. | 437/188 |
| 5,317,187 | 5/1994 | Hindman et al. | 257/659 |
| 5,534,463 | 7/1996 | Lee et al. | 437/195 |
| 5,589,713 | 12/1996 | Lee et al. | 257/773 |

FOREIGN PATENT DOCUMENTS

| | | |
|---|---|---|
| 63-99546 | 4/1988 | Japan . |
| 1-246831 | 10/1989 | Japan . |
| 2-26052 | 1/1990 | Japan . |
| 90-15277 | 3/1989 | Rep. of Korea . |

OTHER PUBLICATIONS

Dipankar Pramanik et al., "Effect of Underlayer on Sputtered Aluminum Grain Structure and Its Correlation with Step Coverage in Submicron Vias", VMIC Conference, Jun. 12, 1990, pp. 332–334.

C.S. Park et al., "Al–Plaph (Aluminum–Planarization by Post–Heating) Process for Planarized Double Metal CMOS Applications", VMIC Conference, Jun. 12, 1991, pp. 326–328.

H.P. Kattelus et al., "Bias–induced Stress Transitions in Sputtered TiN Films", J. Vac Sci. Technol. vol. 4, Jul./Aug. 1986, pp. 1850–1854.

SEMICONDUCTOR DEVICE AND MANUFACTURING METHOD THEREOF

This is a division of application Ser. No. 08/008,775, filed Jan. 25, 1993 which is now U.S. Pat. No. 5,534,463 which is a continuation in part of application Ser. No. 07/897,294, May 11, 1992, now U.S. Pat. No. 5,318,923.

BACKGROUND OF THE INVENTION

The present invention relates to a semiconductor device and manufacturing method thereof, and more particularly to a semiconductor device including a wiring layer and method for forming a wiring layer. The present invention is an improvement over the invention which is the subject matter of the present inventor's U.S. Pat. No. 5,318,923 filed on Aug. 24, 1992 which is a continuation-in-part of the U.S. patent application Ser. No. 07/585,218 filed on Sep. 19, 1990, which has now been abandoned, and the disclosure of which is hereby incorporated into this application by reference.

The metallization process is regarded as being the most important matter of semiconductor device manufacturing technology, since it determines the yield, performance (e.g., speed of operation), and reliability of the devices, as the technology advances toward ultra large-scale integration (ULSI). Metal step coverage was not a serious problem in less dense prior art semiconductor devices, because of the inherent features of devices having larger geometries, e.g., contact holes having low aspect ratios (the ratio of depth to width), and shallow steps. However, with increased integration density in semiconductor devices, contact holes have become significantly smaller while impurity-doped regions formed in the surface of the semiconductor substrate have become much shallower. Due to the resulting higher aspect ratio of the contact holes and larger steps, with these current, greater-density semiconductor devices, it has become necessary, to improve the conventional aluminum (Al) metallization process, in order to achieve the standard design objectives of high-speed performance, high yield, and good reliability of the semiconductor device. More particularly, the utilization of the conventional Al metallization process in the fabrication of the higher-density integrated semiconductor devices has resulted in such problems as degraded reliability and failure of the Al interconnections due to the high aspect ratio of the contact holes and poor step coverage of the sputtered Al, increase in contact resistance caused by silicon (Si) precipitation, and degradation of the shallow junction characteristics due to Al spiking.

FIG. 1 illustrates a cross-sectional view of a portion of a semiconductor wafer having a metal wiring layer formed thereon obtained according to a prior art method, which illustrates a void formation. Referring to FIG. 1, an insulating layer 5 is formed on a semiconductor substrate 1. Then, a contact hole having a high aspect ratio greater than one, which exposes an impurity-doped region 3 formed in a surface portion of semiconductor substrate 1, is formed in an insulating layer 5 and on impurity-doped region 3. Thereafter, a diffusion barrier layer 7 is formed on insulation layer 5, on the inner surface of the contact hole and on the exposed surface portion of impurity-doped region 3, and a metal layer 9a is deposited by a conventional sputtering method. Here, due to the high aspect ratio of the contact hole, an overhanging portion 15 of the deposited metal layer 9a is formed over the contact hole and a void 11a formation occur in the contact hole, which deteriorates the reliability of metal layer 9a of a semiconductor device.

In an effort to overcome these problems of the conventional Al metallization process, various new processes have been proposed. For example, for preventing degraded semiconductor reliability caused by the above-mentioned failure of Al interconnections, the following processes have been proposed.

Melting methods have been disclosed in such patent publications such as Japanese Laid-Open Publication No. 62-132348 (by Yukiyasu Sugano et al.), Japanese Laid-Open Publication No. 63-99546 (by Shinpei Iijima), Japanese Laid-Open Publication No. 62-109341 (by Masahiro Shimizu et al.), Japanese Laid-Open Publication No. 62-211915 (by Hidekazu Okabayashi et al.), Japanese Laid-Open Publication No.1-246831 (by Seiichi Iwamatsu), Japanese Laid-Open Publication No. 59-171374 (by Masaki Satou) and European Patent Application No. 87306084.3 (by Ryoichi Mukai et al.). Particularly, according to Yukiyasu Sugano et al teaching, a metal wiring layer comprised of a metal having a low melting temperature such as Al, Sn, In, Pb, Mg, Zn etc. or an alloy thereof is melted thermally, to thereby be flattened.

According to the above method, the contact hole is filled by means of melting and reflowing Al or an Al alloy. To summarize, in the reflowing step, the metal layer of Al or Al alloy is heated beyond its melting temperature, and the thus melted metal is flowed into the contact hole to fill the same. This reflowing step entails the following drawbacks and disadvantages. First of all, the semiconductor wafer must be disposed horizontally so as to allow proper filling of the contact hole with the flowing melted material. Secondly, the liquid metal layer flowed into the contact hole will seek a lower surface tension, and thus, may, upon solidifying, shrink or warp, and thereby expose the underlying semiconductor material. Further, the heat treatment temperature cannot be precisely controlled and therefore, given results are difficult to reproduce. Moreover, although these methods may fill a contact hole with the melted metal of the metal layer, the remaining areas of the metal layer (outside the contact hole area) may become rough, thereby impairing subsequent photolithography processes. Therefore, a second metallization process may be required to smooth or planarize these rough areas of the metal layer.

In the meantime, Ono et al. have disclosed that when the semiconductor substrate temperature is above 500° C., the liquidity of Al—Si suddenly increases (in Proc., 1990 VMIC Conference, June 11 and 12, pp. 76–82). According to this paper, the stress of an Al-1%Si film changes abruptly near 500° C., and the stress relaxation of such a film occurs rapidly at that temperature. Additionally, the temperature of the semiconductor substrate must be maintained between 500° C. and 550° C. in order to fill the contact holes satisfactorily.

Additionally, Yoda Dakashi et al. have suggested a method for manufacturing a semiconductor device which comprises the steps of forming double barrier layers for preventing a reaction between the wiring layer and the semiconductor substrate or an insulation layer, on the inner surface of the contact holes, and then filling the contact holes with a deposited metal such as an Al—Si alloy while heating the semiconductor substrate to a desired temperature of 500° C. to 550° C., as in Ono et al. paper (Korean Laid-open Patent Publication No. 90-15277 and European Patent Application No. 90104184.0 corresponding to Japanese Patent Application No. 01-061557 filed on Mar. 14, 1989.).

According to the Yoda Dakashi et al. and Ono et al. methods, an Al—Si film is deposited at a temperature of 500° C. to 550° C. The Al—Si film thus obtained has a grown-up large diameter of crystalline particles of about 10 microns. Therefore, there is a high probability that the Al—Si film has a strong resistance against electron migration but a weak resistance against stress migration. In addition, high resistant Si is crystallized at interfaces between crystalline particles of the Al—Si film. Thus, it is necessary to remove the Al—Si film at the areas other than the contact hole area and the metallization process become complicated. Additionally, since the Al—Si film is deposited at a high temperature, a void is formed or metal layer discontinuities occur. FIG. 2 illustrates a void formation lib when depositing a metal layer at a high temperature. In the same figure, the reference numerals indicate the same portion as in FIG. 1, except for metal layer 9b deposited at a high temperature and void 11b. Also, FIG. 3 illustrates a discontinuity 13 of a metal layer 9c formed in a contact hole, when depositing a metal layer at a high temperature. In the same figure, the reference numerals indicate the same portion as in FIG. 1, except for metal layer 9c deposited at a high temperature and the discontinuity 13.

As an alternative to melting Al or Al alloy for filling contact holes, and in order to improve the metal step coverage, a multiple step metallization process is disclosed in U.S. Pat. No. 4,970,176 (Clarence J. Tracy et al.). According to this patent, a predetermined first thickness of a metal layer is deposited on a semiconductor wafer at a cold temperature. Then, the temperature is increased to-approximately 400° C. to 500° C., which allows the metal layer to reflow while depositing the remaining and relatively thin second thickness of the metal layer. The reflow of the metal layer takes place through grain growth, recrystallization and bulk diffusion.

According to the Tracy et al. method, the step coverage of a contact hole (via hole) having a high aspect ratio can be improved. However, there is high probability that a void lib as in FIG. 2 or a discontinuity 13 as in FIG. 3 forms in a metal layer, since the metal layer is deposited at a high temperature. Additionally, the aluminum or aluminum alloy cannot completely fill a contact hole having an aspect ratio greater than one and a diameter less than 1 $\mu$m.

Additionally, C. S. Park et al. (which includes the present inventors) have disclosed a method for forming a metal wiring layer through a contact hole having a high aspect ratio which comprises the steps of depositing an aluminum alloy to a thickness of 3000 Å at a low temperature below 100° C. and post-heating the deposited aluminum alloy at a temperature of 550° C. for 180 seconds. to thereby completely fill up the contact hole with aluminum alloy, in Proc., 1991 VMIC Conference, June 11 and 12, pp. 326–328. This method is included in U.S. patent application Ser. No. 07/585,218 entitled "A Method for Forming a Metal Layer in a Semiconductor Device," which has now been abandoned and a continuation-in-part thereof U.S. Pat. No. 5,318,923.

FIGS. 4 through 6 show a method for forming a metal layer according to the above invention. FIG. 4 illustrates a step for forming a first metal layer. A 0.8 $\mu$m-sized contact hole 22 having a step formed thereon is formed in an insulating layer 25 coated on semiconductor substrate 10. Then, substrate 21 is put into a sputtering reaction chamber (not shown), in which a first metal layer 27 is formed by depositing a metal such as aluminum (Al) or Al alloy, at a temperature of 150° C. or less and under a predetermined degree of vacuum. First metal layer 27 thus obtained is comprised of small aluminum grains having a high surface free energy.

FIG. 5 illustrates the method of filling contact hole 22. More particularly, after the semiconductor wafer thus obtained is moved into another sputter reaction chamber (not shown), without breaking the vacuum, first metal layer 27 is heat-treated for at least two minutes at a temperature of 550° C., thereby filling up the contact hole 22 with the metal. At this time, the pressure in the reaction chamber is preferably as low as possible so that the aluminum atoms have a higher surface free energy. In this manner, the metal atoms can more easily migrate into the contact holes, thereby filling them. The reference numeral 27a designates a metal layer filling contact hole 22.

The heat treatment temperature range in the step shown FIG. 5 is between 80% of the melting point of the metal and the melting point of the metal, and will vary according to the particular aluminum alloy or aluminum employed.

Since the metal layer is heat-treated at a temperature lower than aluminum's melting point, the metal layer does not melt. For example, at 550° C., the Al atoms deposited by sputtering at a temperature below 150° C. migrate upon heat-treatment at a higher temperature, instead of melting. This migration increases when the surface area is uneven or grainy due to an increase in energy among the surface atoms which are not in full contact with surrounding atoms. Thus, the initially sputtered, grainy layer exhibits an increase in atomic migration upon heat-treatment.

FIG. 6 illustrates a step for forming a second metal layer 29. More particularly, second metal layer 29 is formed by depositing the remainder of the required total metal layer thickness at a temperature selected on the basis of the desired reliability of the semiconductor device, for example at a temperature below 350° C. This completes the formation of the total (composite) metal layer.

According to the above method, the contact hole can be easily and fully filled with metal, by using the same sputtering equipment used for the conventional deposition method and then annealing the deposited metal. Therefore, even a contact hole with a high aspect ratio can be completely filled. However, when a void is formed in the contact hole or when the step coverage of the metal layer is inadequate, the contact hole cannot be filled up while maintaining such a semiconductor wafer with metal layer at a certain temperature and vacuum level. Further, although a secondary metal layer is subsequently formed on the semiconductor wafer having a previously deposited primary metal layer, good step coverage of the contact hole cannot be assured, and the reliability of the manufactured semiconductor device is degraded due to this inadequate step coverage.

For preventing a void formation and obtaining a good step coverage and a planarized surface of a wiring layer, S. I. Lee (one of the present inventors) et al. have an invention entitled "Method for Manufacturing a Semiconductor Device," and filed as U.S. Pat. No. 5,266,521 now pending in the USPTO. This invention relates to a method for forming a metal wiring layer through a contact hole in a semiconductor device, which comprises the steps of forming a first metal layer on a semiconductor substrate coated with an insulating layer having a contact hole formed thereon, heat-treating the first metal layer to completely fill up the contact hole with a metal of the first metal layer, forming a second metal layer on the first metal layer and then heat-treating the second metal layer to planarize a surface thereof.

According to the invention described in the Lee et al. application, the above second metal layer is heat-treated in the same manner as the first metal layer, to thereby planarize the surface of the metal layer to thereby improve a subsequent photolithography process before forming a metal wiring pattern. Additionally, a metal with no Si component and a metal with a Si component may be deposited to form a composite metal layer. When the temperature of the semiconductor substrate is lowered, a metal layer with no Si component absorbs Si atoms from the metal with the Si component. Therefore, Si precipitates are not formed on the surface of the semiconductor substrate after forming the wiring pattern. Although Si precipitate formation is prevented, when forming a composite metal layer according to the above invention, when a poor diffusion barrier layer formed on the inner surface of a contact hole exists, a fine junction spiking occurs, by which the junction is deteriorated, and which, over time, will increase leakage current.

For preventing this fine junction spiking, Lee et al. further have an invention entitled "Semiconductor Device and Manufacturing Method thereof", and filed as U.S. Pat. application Ser. No. 5,355,020 now pending in the USPTO.

It is also presently known that, for improving the reliability of the semiconductor by preventing degradation of the shallow junction characteristics due to Al spiking, a barrier layer can be formed in the contact hole formed on the semiconductor wafer. For example, the formation of a titanium nitride film by a reactive sputtering method is disclosed in J. Vac. Sci. Technol., A4 (4), 1986, pp. 1850–1854. In U.S. Pat. No. 4,897,709 (by Natsuki Yokoyama et al.), there is described a semiconductor device including a titanium nitride film serving as a barrier layer which is formed in a contact hole for preventing a reaction between the metal wiring layer and the semiconductor substrate. The titanium nitride film can be formed by a low pressure CVD method implemented with a cold-type CVD apparatus. The resultant film has excellent characteristics with good step coverage for a considerably fine hole having a large aspect ratio. After forming the titanium nitride film, a wiring layer is formed by a sputtering method using an Al alloy.

Additionally, in the above-mentioned Yoda Dakashi et al patent publication, there is disclosed a method for manufacturing a semiconductor device which comprises the step of forming double barrier layers for preventing a reaction between the wiring layer and the semiconductor substrate or an insulation layer, on the inner surface of the contact hole.

Additionally, in Japanese Patent Laid-open Publication No. 61-183942, there is described a method for forming a barrier layer which comprises the steps of forming a refractory metal layer by depositing a metal such as Mo, W, Ti or Ta, forming a titanium nitride layer on the refractory metal layer, and heat-treating the metal layer and the titanium nitride layer to thereby form a refractory metal silicide layer at the inter-surface of the refractory metal layer and semiconductor substrate by a reaction therebetween. Thus, the barrier characteristic is improved. The heat-treatment the diffusion barrier layer is performed by an annealing process under a nitrogen atmosphere at a temperature of 450° C. for about 30 minutes. When the barrier layer does not undergo the annealing process, a junction spiking occurs in a subsequent sintering step after Al sputtering or in sputtering Al or an Al alloy at a temperature above 450° C., which is undesirable.

Also, after forming the diffusion barrier layer, a semiconductor wafer should be transported into a sputtering apparatus for forming a metal wiring layer. Thus, the diffusion barrier layer is exposed to the atmosphere. Exposing the diffusion barrier layer to the atmosphere or annealing process enables a quite small amount of atoms of the diffusion barrier layer to react with oxygen to form a very thin oxide layer on the surface portion of the diffusion barrier layer, which improves the diffusion barrier effect. This is called a "stuffing effect." On the oxide layer, the mobility of aluminum atoms reduces and when depositing an Al-1% Si-0.5% Cu alloy to a thickness of about 6,000 Å at a room temperature, the metal layer thus obtained has a grain size as small as 0.2 μm. Thus, the step coverage of a sputtered Al is insufficient.

In the meantime, on a diffusion barrier layer which is not exposed to the atmosphere or the annealing process, aluminum reacts with the diffusion barrier layer during a subsequent heat-treating step at a high temperature or when depositing an aluminum film by sputtering at a high temperature, to thereby deteriorate the barrier effect of the diffusion barrier layer. Additionally, the surface of the Al metal layer becomes rugged and a surface reflectivity thereof becomes low, which lowers the efficiency of a subsequent photolithography process. Therefore, the annealing process is essential.

To improve wettabilities between the barrier metal and an Al wire, Hagita Masafumi suggested a method for forming a diffusion barrier layer comprising a step of implanting oxygen or silicon into the barrier metal after heat-treating TiN layer as a diffusion barrier layer (Japanese Patent Laid-Open Publication No.2-26052). Also, Dipankar Pramanik et al. reported a grain size and intragrain roughness of aluminum films studied for various underlayer ("Effect of Underlayer on Sputtered Aluminum Grain Structure and Its correlation with Step Coverage in Submicron Vias", by Dipankar Pramanik and Vivek Jain, Jun. 12–13, 1990 VMIC Conference pp 332–334). According to Dipankar Pramanik et al., when at an initial stage of Al deposition, a large island is formed on the sidewalls, and excellent step coverage was obtained to thereby result a continuous Al film. From this, it can be noted that if the grain size on the sidewalls is large, a continuous metal film can be obtained and can easily migrate into a contact hole without discontinuity of a metal layer when heat-treating the metal layer according to the C. S. Park method. This is due to the increased wettability between the underlayer and the sputtered Al.

The present inventors have found that providing a reactive spacer which has a good wettability with a sputtered Al on the sidewalls of a contact hole and therefore produces a large island at the initial sputtering stage (that is, large grain of the sputtered Al film), improves the step coverage of the sputtered Al film and the reflow of the Al metal layer into the contact hole. On these bases, the present invention has been accomplished.

SUMMARY OF THE INVENTION

Accordingly, it is an object of the present invention to provide a semiconductor device including a reliable wiring layer which comprises a reactive spacer or layer formed on a side wall of a contact hole, which can enhance the wettability of the Al sputtered film at an initial deposition stage to thereby prevent a void formation of a metal layer in the depositing step, and improves the reflow of the sputtered Al film to thereby prevent a discontinuity of a metal layer in a subsequent heat-treating step for filling the contact hole.

Another object of the present invention is to provide a method for manufacturing a semiconductor device including a wiring layer as above.

Briefly, according to the present invention, there is provided a semiconductor device comprising a reactive spacer formed on the sidewall of a recessed portion, which improves step coverage of a conductive layer in a depositing step and enhances reflow of a material of the conductive layer in a step of reflowing of the material of the conductive layer by heat-treating the conductive layer, after forming the conductive layer.

Additionally, the present invention provides a semiconductor device comprising a reactive layer formed on the inner surface a recessed portion, which improves step coverage of a conductive layer in a depositing step and enhances reflow of a material of the conductive layer in a step of reflowing of the material of the conductive layer by heat-treating the conductive layer, after forming the conductive layer.

Examples of such a recessed portion are an opening such as a contact hole or a via and a groove.

Also, the above object of the present invention may be accomplished by providing a semiconductor including a wiring layer comprising: a semiconductor substrate; an insulating layer having an opening formed on the semiconductor substrate, the opening exposing a portion of a surface of an underlying layer of the insulating layer; a reactive spacer formed on a side wall of the opening; and a first conductive layer formed on the insulating layer, on the reactive spacer and on the exposed surface portion of the underlying layer. Here, the opening is a contact hole which extends to the surface of the semiconductor substrate, thereby exposing a portion of the surface of the semiconductor substrate or a via which connects an upper conductive layer to a lower conductive layer in a multilevel interconnection and exposes a portion of the lower conductive layer underlying the insulating layer.

According to one aspect of the present invention, the reactive spacer or layer is comprised of an element which lowers the melting point of a material of the first conductive layer. Any element may be used in the present invention so far as it lowers the melting point of the material of the first conductive layer. The elements used in the present invention include, for example, Ge, Mg, Sn, In, Pb, Zn etc. These elements may be used either alone or in a mixture thereof.

According to another aspect of the present invention, the reactive spacer or layer may be comprised of transition metals such as Ti, Mo, Ta, W etc or transition metal compounds such as TiN. These transition metals and transition metal compounds may be used either alone or in a mixture thereof.

Additionally, according to the present invention, there is provided a method for manufacturing a semiconductor device including a wiring layer, comprising the steps of: forming an insulating layer on a semiconductor substrate; providing the insulating layer with an opening exposing a portion of a surface of an underlying layer of the insulating layer; forming a reactive spacer on a side wall of the opening; and forming a first conductive layer on the insulating layer, on the reactive spacer and on the exposed surface portion of the underlying layer. The reactive spacer is formed by depositing a reactive material to form a reactive material layer on the insulating layer, on a sidewall of the opening and the exposed surface portion of the underlying layer and selectively removing the reactive material layer on the insulating layer and the exposed surface portion of the underlying layer by an etch-back process.

Additionally, the present invention provides a method for manufacturing a semiconductor device including a wiring layer, comprising the steps of: forming an insulating layer on a semiconductor substrate; providing the insulating layer with an opening exposing a portion of a surface of an underlying layer of the insulating layer; forming a reactive spacer on a sidewall of the opening; forming a first conductive layer on the insulating layer, on the reactive spacer, and on the exposed surface portion of said underlying layer; and heat-treating the first conductive layer for an appropriate time to fill up the opening with the material of said first conductive layer, without breaking vacuum after forming the first conductive layer.

Further, the present invention provides a method for manufacturing a semiconductor device including a wiring layer, comprising the steps of: forming an insulating layer on a semiconductor substrate; providing the insulating layer with an opening exposing a portion of a surface of an underlying layer of the insulating layer; forming a reactive layer on a sidewall of the opening and on the exposed surface portion of the underlying layer; forming a first conductive layer on the insulating layer and on the reactive layer; and heat-treating the first conductive layer for an appropriate time to fill up the opening with the material of the first conductive layer without breaking vacuum after forming the first conductive layer.

Since the reactive spacer or layer is formed on the sidewall of the opening, when the first conductive layer material is deposited, large islands will form to become large grains of the sputtered Al film. Also, providing the reactive spacer or layer improves the reflow of the first conductive layer during a heat-treating step for filling the opening at a high temperature below a melting temperature.

BRIEF DESCRIPTION OF THE DRAWINGS

Further features and advantages of the present invention will be apparent to those skilled in the art from the following detailed description of the invention, taken together with the accompanying d wings, in which.

DESCRIPTION OF THE PREFERRED EMBODIMENTS

FIGS. 7 through 12 illustrate embodiments of the wiring layer according to the present invention.

Figure 1:
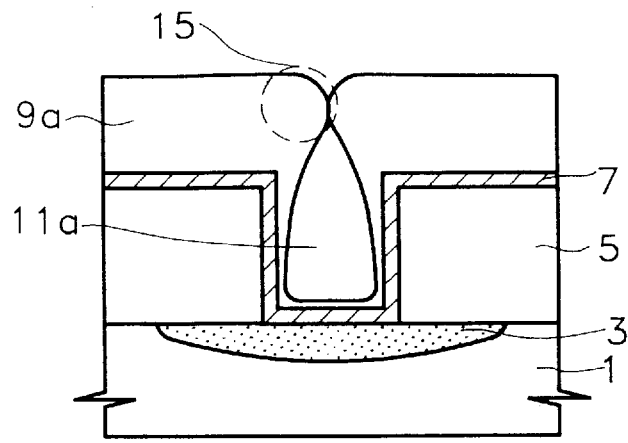
FIG. 1 illustrates a void formation when depositing a metal layer on a semiconductor wafer having a contact hole by a conventional sputtering method.
Figure 2:
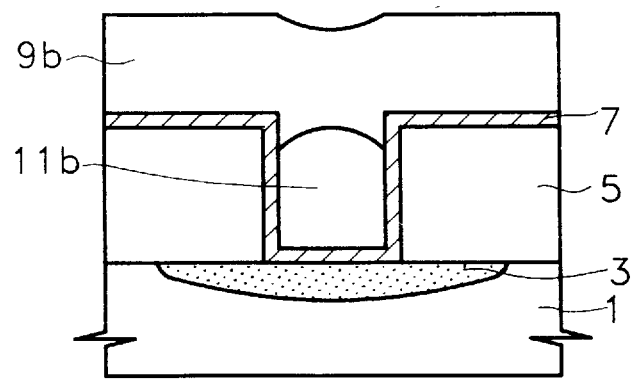
FIG. 2 illustrates a void formation when depositing a metal layer on a semiconductor wafer having a contact hole at a high temperature by a conventional method.
Figure 3:
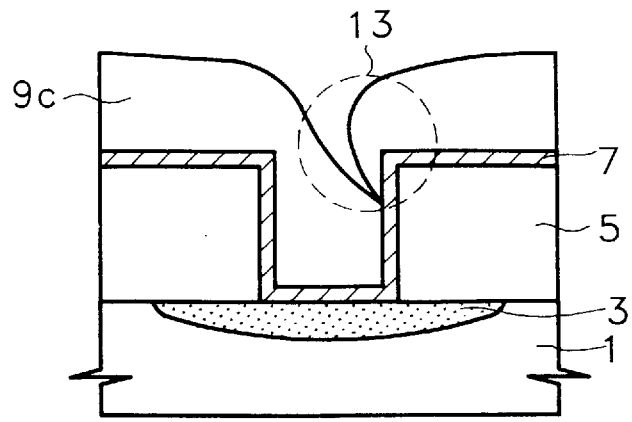
FIG. 3 illustrates a short of a metal layer formed in a contact hole, when depositing a metal layer on a semiconductor wafer at a high temperature by a conventional method.
Figure 4:
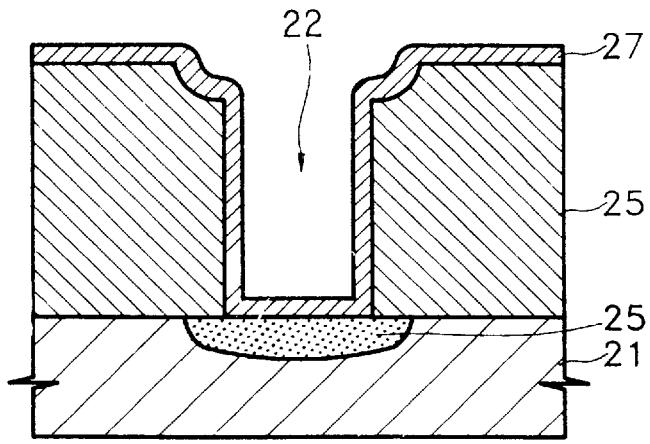
FIGS. 4 through 6 illustrate a method for forming a metal layer (as described in U.S. Pat. No. 5,318,923.
Figure 5:
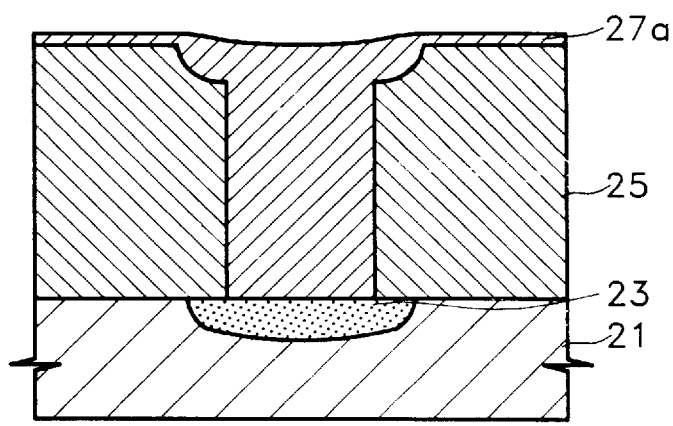
Figure 6:
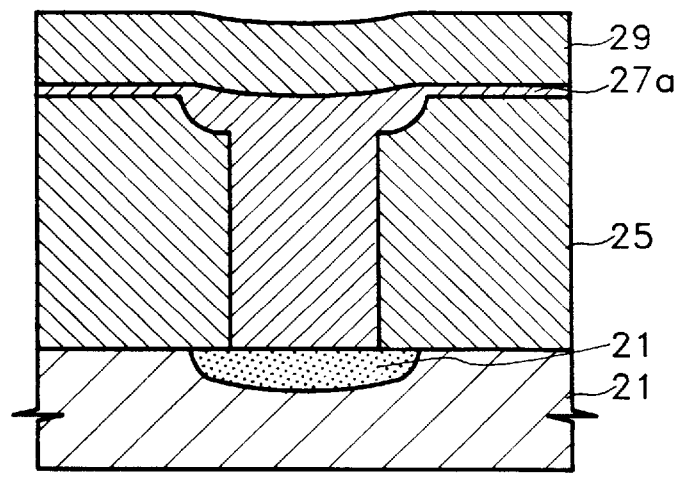
Figure 7:
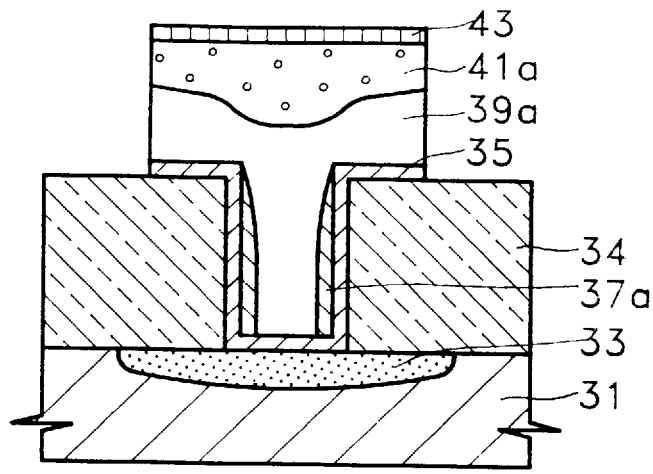
FIGS. 7 through 12 illustrate embodiments of the wiring layer according to the present invention.

FIG. 7 is a cross-sectional view of a wiring layer according to one embodiment of the present invention.

As shown in FIG. 7, the wiring layer of this embodiment comprises a semiconductor substrate 31 having an impurity-doped region 33 in a surface portion thereof, an insulating layer 34 having a contact hole as an opening, a diffusion barrier layer 35 formed on the surface of insulating layer 34, on the inner surface of the contact hole and on the exposed surface portion of semiconductor substrate 31 wherein impurity-doped region 33 has been formed, a reactive spacer 37a formed on a sidewall of the contact hole, a first conductive layer 39a formed on diffusion barrier layer 35 and reactive spacer 37a which completely fills up the contact hole, a second conductive layer 41a having a planarized surface formed on first conductive layer 39a and an anti-reflective layer 43 formed on second conductive layer 41a.

As an insulating layer used in the present invention, any conventional insulating layer such as a $Sio_2$ layer, BPSG layer, SOG layer, BSG layer, etc., may be mentioned. Among these, BPSG is preferably used. In this embodiment, the size of the contact hole (defined as the contact hole's diameter) is about 0.8 μm and the aspect ratio thereof is about 1.0 or more. Diffusion barrier layer 35 consists of a first diffusion barrier composed of a transition metal such as Ti and a second diffusion barrier composed of a transition metal compound such as titanium nitride. The thicknesses of the first and second diffusion barrier layers are preferably about 200–500 Å and about 300–1500 Å, respectively.

Reactive spacer 37a is comprised of Ti or TiN and its width is about 100 to 200 Å, and preferably about 150 Å. Other transition metals such as Mo, Ta, W etc. or compounds thereof may replace the Ti or TiN. Also, a metal which lowers the melting point of the material of a first conductive layer may replace the Ti or TiN. Such metals include Ge, Mg, Sn, In, Pb, Zn etc. Reactive spacer 37a improves the wettability of the sputtered Al during a depositing step for forming a conductive layer. As a result, large islands are formed on the sidewall of the contact hole at the initial stage of depositing step, to become relatively large grains of the sputtered Al film. Thus, the step coverage of Al film is excellent and the reflow of the sputtered Al film is increased to completely fill the contact hole.

First conductive layer 39a is comprised of Al-0.5%Cu alloy. According to another embodiment of the present invention, first conductive layer 39a filling the contact hole consists of a first metal layer having a Si component and a second metal layer having no Si component. As a metal having a Si component, an Al-Si alloy (Al-1%Si alloy), Al-Cu-Si alloy (Al-0.5%Cu-1%Si alloy), etc. may be mentioned. As a metal having no Si component, pure aluminum, an Al—Cu alloy (Al-0.5%Cu alloy), Al—Ti alloy, etc. may be mentioned.

The thickness of first conductive layer 39a formed by a sputtering method is not limited as long as its thickness is enough to fill up the contact hole by heat-treating at a temperature of 0.8 Tm to Tm, where Tm is the melting temperature of the metal constituting first conductive layer 39a or the melting temperature of the first metal when first conductive layer 39a is a composite layer consisting of a first metal layer and a second metal layer, and an overhanging portion of the conductive layer does not form during a deposition step. The thickness of the first conductive layer on the insulating layer is preferably about one-third to two-thirds of a predetermined thickness of the wiring layer. More particularly, when the contact hole size is 0.8 μm and the thickness of a wiring layer is 0.6 μm, the thickness of the first conductive layer is preferably about 2,000–4,000 Å. When the first conductive layer is a composite layer consisting of a first metal layer and second metal layer as described above, the thicknesses of the first and second metal layers are not limited as long as the first conductive layer thus obtained does not produce a Si precipitate. Both the first and the second metal layers are preferably thicker than about 500 Å, while considering their uniformity. For preventing formation of a Si precipitate, the first metal layer preferably has a thickness not more than one quarter of a predetermined thickness of the wiring layer and the second metal layer preferably has a thickness not less than five-twelfths of a predetermined thickness of the wiring layer. The boundary (not shown) between the first metal layer and the second metal layer may be obscure in the contact hole since they flow into the contact hole during the heat-treating step after their deposition, but still remains on the insulating layer.

Second conductive layer 41a having a planarized surface is comprised of a metal having no Si component as above. The thickness of second conductive layer 41a is preferably about one-third to two-thirds of a predetermined thickness of a wiring layer. More particularly, in this embodiment, second conductive layer 41a has a thickness of about 2,000–4,000 Å on insulating layer 34.

Anti-reflective layer 43 may be formed on second conductive layer 41a for preventing unwanted reflections in a subsequent photolithography step, for example, a step for forming a wiring pattern. The anti-reflective layer 43 is preferably composed of a transition metal compound such as titanium nitride.

Figure 8:
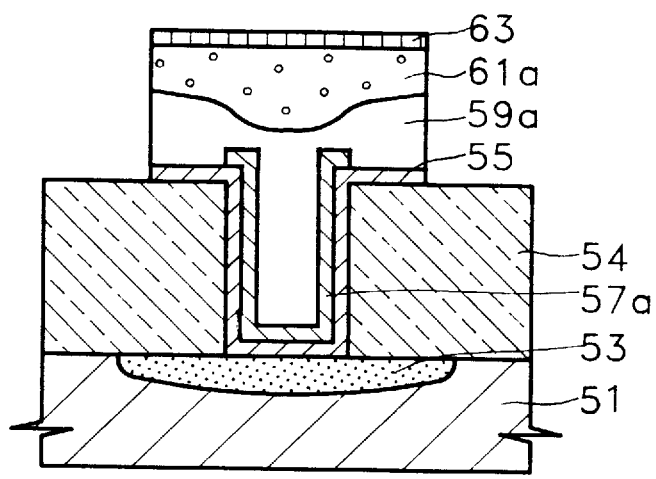

FIG. 8 is a cross-sectional view of a wiring layer according to another embodiment of the present invention.

As shown in FIG. 8, the wiring layer of this embodiment comprises a semiconductor substrate 51 having an impurity-doped region 53 in a surface portion thereof, an insulating layer 54 having a contact hole, a diffusion barrier layer 55 formed on the surface of insulating layer 54, on the inner surface of the contact hole and on the exposed surface portion of semiconductor substrate 51 wherein impurity-doped region 53 has been formed, a reactive layer 57a formed on the sidewall and on the bottom surface of the contact hole, a first conductive layer 59a formed on diffusion barrier layer 55 and reactive layer 57a which completely fills the contact hole, a second conductive layer 61a having a planarized surface formed on first conductive layer 59a and an anti-reflective layer 63 formed on second conductive layer 61a.

Insulating layer 54, the contact hole, diffusion barrier layer 55, first and second conductive layers 59a and 61a and anti-reflective layer 63 are the same as in FIG. 7. Therefore, the same explanations concerning those portions will be given as the description with respect to FIG. 7. Concerning reactive layer 57a, the same explanation will be given as the description with respect to reactive spacer 37a of FIG. 7, except that reactive layer 57a is formed on the side wall and on the bottom surface of the contact hole.

Figure 9:
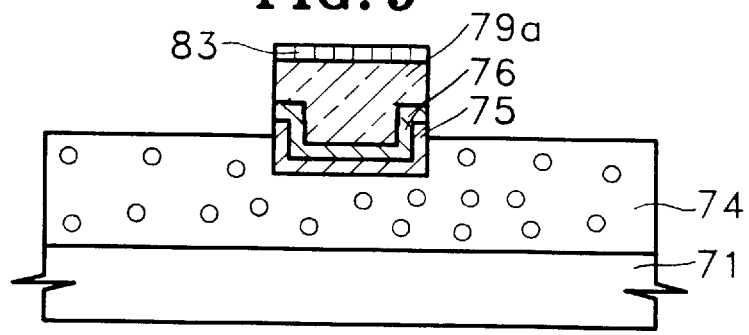

FIG. 9 is a cross-sectional view of a wiring layer according to still another embodiment of the present invention.

As shown in FIG. 9, the wiring layer of this embodiment comprises a semiconductor substrate 71, an insulating layer 74 having a groove as a recessed portion, a diffusion barrier layer 75 formed on an inner surface of the groove, a reactive layer 76 formed on diffusion barrier layer 75 of the groove, a planarized conductive layer 79a formed on reactive layer 76 which completely fills the groove and an anti-reflective layer 83 formed on planarized conductive layer 79a.

Insulating layer 74, diffusion barrier layer 75 and reactive layer 76 are the same as that of FIG. 8. Therefore, the same explanations concerning those portions will be given as the description with respect to FIG. 8. Planarized conductive layer 79a may be composed of a single layer or a composite layer which is comprised of Al or an Al alloy. In the case of a composite layer, the same explanation will be given as the description with respect to first and second conductive layers 59a and 61a.

Figure 10:
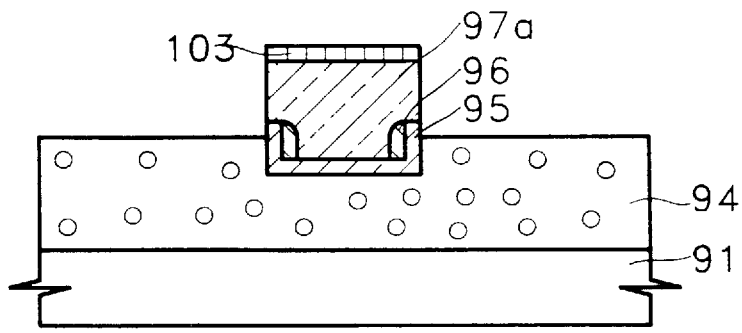

FIG. 10 is a cross-sectional view of a wiring layer according to still another embodiment of the present invention.

As shown in FIG. 10, the wiring layer of this embodiment comprises a semiconductor substrate 91, an insulating layer 94 having a groove as a recessed portion, a diffusion barrier layer 95 formed on an inner surface of the groove, a reactive spacer layer 96 formed on a sidewall of the groove, a planarized conductive layer 97a formed on reactive spacer 95 and diffusion barrier layer 95 which completely fills the groove and an anti-reflective layer 103 formed on planarized conductive layer 97a.

Insulating layer 94, diffusion barrier layer 95 and reactive spacer 96 are the same as those of FIG. 7. Therefore, the same explanations concerning those portions will be given as the description with respect to FIG. 7. Also, Planarized conductive layer 97a is the same as that of FIG. 9. Therefore, a detailed explanation in this regard will be omitted.

Figure 11:
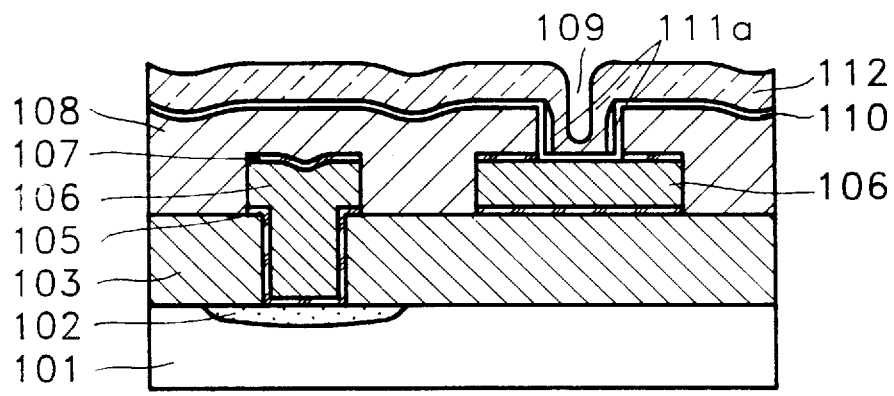
Figure 12:
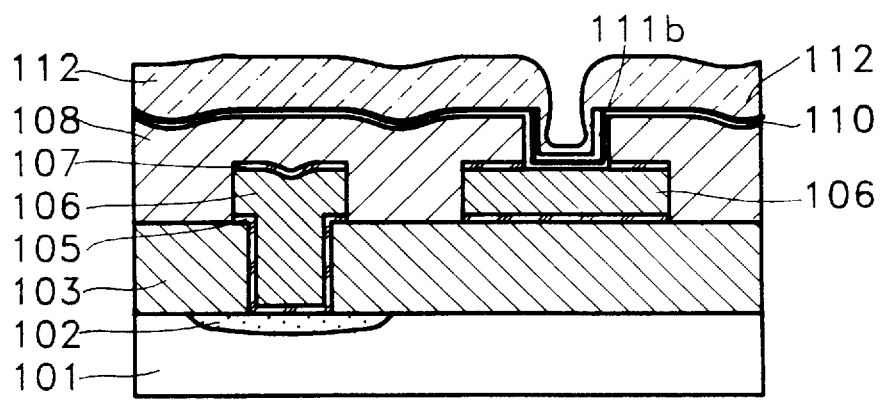

FIGS. 11 and 12 are cross-sectional views of a wiring layer according to still other embodiments of the present invention wherein the wiring layer is formed on an insulating interlayer having a via which connects an upper wiring layer to a lower wiring layer.

Both the wiring layers of FIGS. 11 and 12 comprise a semiconductor substrate 101 having an impurity doped region 102, an insulating layer 103 having a contact hole which exposes a portion of impurity doped region 102 and connects a lower wiring layer thereto, a first diffusion barrier layer 105 formed on the inner surface of the contact hole (that is, on the sidewall of the contact hole and on an exposed surface of semiconductor substrate 101) and insulating layer 103, a lower wiring layer 106 formed on first diffusion barrier layer 105 which completely fills the contact hole and electrically connected to impurity doped region 102, an anti-reflexive layer 107 formed on lower wiring layer 106, an insulating interlayer 108 covering lower wiring layer 106 and having a via which connects an upper wiring layer to lower wiring layer 106, a second diffusion barrier layer 110 formed on insulating interlayer 108 and on the inner surface of the via and an exposed surface of lower wiring layer 106, and an upper wiring layer 112 formed on insulating interlayer 108 which is connected to lower wiring layer 106 through a via. Upper wiring layer 112 of FIG. 11 comprises a reactive spacer 111a formed on a sidewall of the via and upper wiring layer 112 of FIG. 12 comprises a reactive layer 111b formed on the inner surface of the via and on a bottom surface of the via (that is, on the second diffusion barrier layer of the via).

Concerning second diffusion barrier layer 110, reactive spacer and layer 111a and 111b, the same explanation will be given as the description with respect to those of FIGS. 7 and 8. Concerning the other portion of FIGS. 11 and 12 will be described in detail by the following embodiments.

Hereinafter, methods for forming a wiring layer according to the present invention will be described in detail with reference to the following embodiments.

EMBODIMENT 1

FIGS. 13 to 20 illustrate a first embodiment of a method for forming a wiring layer according to the present invention.

Figure 13:
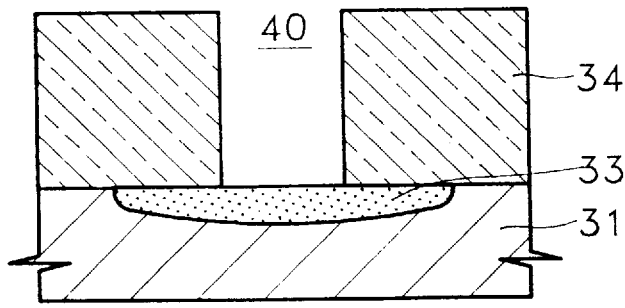
FIGS. 13 through 20 illustrate a first embodiment of a method for forming a wiring layer according to the present invention.

FIG. 13 illustrates a step for forming a contact hole 40 in an insulating layer 34. More particularly, after forming an insulating layer 34 having a thickness of about 1.2 $\mu$m on a semiconductor substrate 31, an opening exposing a surface portion of an underlying layer is formed on a semiconductor substrate 31 provided with insulating layer 32, and then the semiconductor substrate is cleaned. Here, opening is a contact hole 40 having a 0.8 $\mu$m diameter and the aspect ratio thereof is about 1.5. Contact hole 40 exposes a portion of the surface of an impurity-doped region 33 formed in semiconductor substrate 31. Insulating layer 34 is comprised of borophosphorous silicate (BPSG). When a BPSG layer is used as an insulating layer, a high temperature oxide (HTO) layer (not shown in the drawings) is preferably formed between insulating layer 34 and semiconductor substrate 31.

Figure 14:
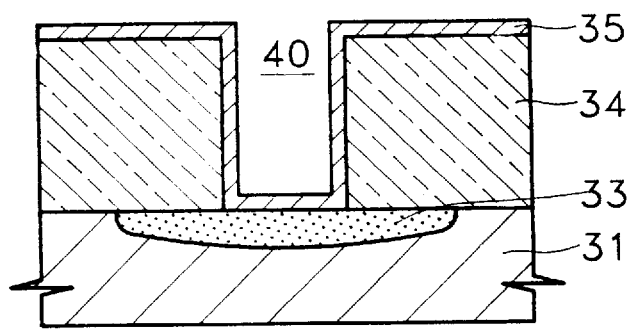

FIG. 14 illustrates a step of forming a diffusion barrier layer 35. After step of FIG. 13, a diffusion barrier layer 35 is formed to a thickness of about 200–1,500 Å on the entire surface of insulating layer 34, on the inner surface of contact hole 41 and on exposed surface portion of semiconductor substrate 31. Diffusion barrier layer 35 is comprised of a material selected from a group consisting of transition metals such as Ti and transition metal compounds such as TiN. Preferably, diffusion barrier layer 35 is a single layer of TiN. However, it is more preferable that a composite layer consisting of a first diffusion barrier layer comprised of a transition metal and a second barrier layer comprised of a transition metal compound is formed as diffusion barrier layer 35. The composite layer as the diffusion barrier layer 35 may be formed by depositing a transition metal such as Ti on the surface of insulating layer 32, on the inner surface of contact hole 40 and on an exposed surface portion of semiconductor substrate 31, to form a first diffusion barrier layer to a thickness of about 200–500 Å, preferably about 300 Å, and depositing on the first diffusion barrier layer a transition metal compound such as TiN to form a second diffusion barrier layer in a thickness of about 300–1,500 Å, preferably about 1,000 Å. Here, TiN is deposited by reactive sputtering in a DC magnetron sputtering chamber. By adjusting a mole ratio of $N_2$ to Ar+$N_2$ to 40%, Ar and $N_2$ gases are introduced into a vacuum chamber and then TiN is deposited at 4 mTorr. At this time, 20 to 100V bias may be supplied to the substrate. Thereafter, diffusion barrier layer 35 is annealed (that is, heat-treated) at a temperature of about 450–600° C. in a nitrogen or ammonia atmosphere for about 30–60 minutes in order to enhance the barrier effect. For obtaining a better diffusion barrier layer, TiN depositing and annealing may be repeated. For example, after depositing TiN layer to a thickness of 500 Å and annealing for 30 minute as above, additional TiN layer of thickness of 500 Å is deposited and annealed.

Figure 15:
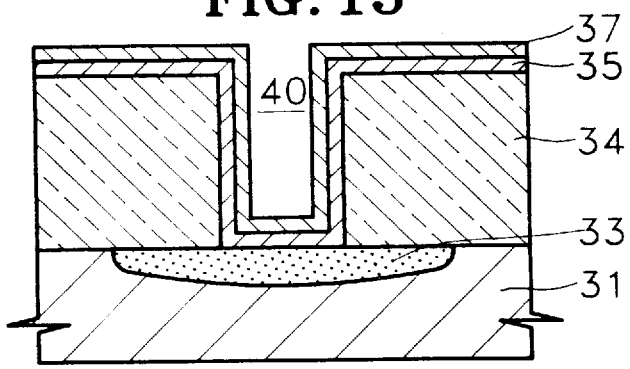

FIG. 15 illustrates a step of forming a reactive material layer 37. After forming diffusion barrier layer 35, a reactive material such as Ti or TiN is deposited to form a reactive material layer 37 of a thickness of 150 Å on diffusion barrier layer 35. Instead of Ti or TiN, other transition metals such as Mo, Ta, W etc. or compounds thereof may be used. Also, a metal which can lower the melting point of the material of the first conductive layer to be formed in a subsequent step, may replace with the Ti or TiN. Such metals include Ge, Mg, Sn, In, Pb, Zn etc. For example, when Ge is deposited in order to form a reactive spacer, and Al is deposited on the reactive spacer, Ge reacts with the Al to form an Al-Ge alloy having a eutectic point of 423° C on the sidewall of contact hole 40. Thus, wettability between the reactive spacer and Al layer is increased to enhance the mobility of the Al grains. As a result, Al atoms can easily migrate into contact hole 40 during a subsequent heat-treatment step. Such a metal is deposited in the same manner as in depositing Ti or TiN at room temperature under a vacuum below 4mTorr, to form a reactive material layer 37 having a thickness of 150 Å.

Figure 16:
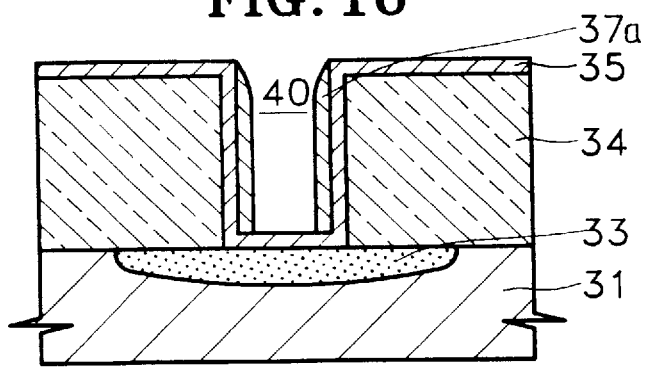

FIG. 16 illustrates a step of forming a reactive spacer 37a on the sidewall of contact hole 40. After forming reactive material layer 37, semiconductor substrate 31 is moved into an apparatus for an etch-back process without breaking vacuum. Then, reactive material layer 37 is etched back to form reactive spacer 37a on the sidewall of contact hole 40. Semiconductor substrate 31 is transported into the apparatus for etch back, under vacuum below $5 \times 10^{-7}$ Torr. The etch-back process may be performed by a radio frequency (RF) sputtering etch-back method using Ar or a fluorine or chlorine containing gas.

Figure 17:
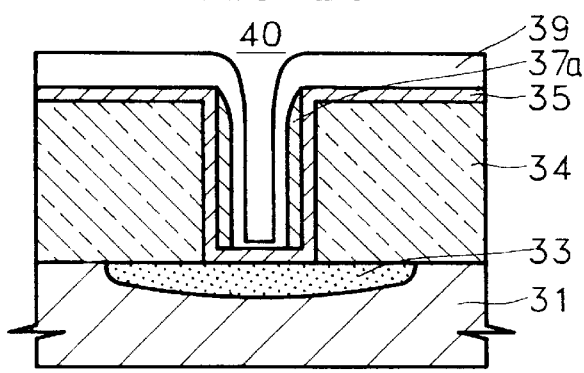

FIG. 17 illustrates a step of forming a first conductive layer 39. After forming reactive spacer 37a, a first conductive layer having a thickness of about one-third to two-thirds (for example, about 4,000 Å) of a predetermined thickness (for example, about 6,000 Å) of a wiring layer is formed on diffusion barrier layer 35 and reactive spacer 37a by depositing a metal such as Al-0.5%Cu alloy at a low temperature below 150° C. Here, a bias voltage of 200–400V may be applied to semiconductor substrate 31 during the depositing step. Deposition is performed at a deposition rate of 100 Å/s and under an Ar atmosphere of 10 mTorr. Controlling the temperature of the substrate is performed by a backside Ar conduction method using 1 mTorr Ar. At this time, the first conductive layer should be deposited continuously without breaking vacuum after forming reactive spacer 37a. If vacuum breaks before forming first conductive layer 39, oxygen atoms in the atmosphere react with molecules of a material of reactive spacer 37a, to form a thin oxide layer on the surface portion of reactive layer 37a. This oxide layer reduces the mobility of the molecules of first conductive layer 39 in a subsequent heat-treating step, thereby preventing contact hole contact hole 40 from being completely filled with the material of first conducive layer 39.

When there is no reactive spacer and a metal layer having a thickness of 4,000 Å is deposited using Al-1%Si-0.5%Cu, the deposited metal layer has a 0.1–0.2 μm grain size. In the meantime, when depositing is performed after forming a reactive spacer 37a according to the present invention, the deposited metal layer has a 0.3–0.4 μm grain size on reactive spacer 37a. This proves that mobility of the metal layer is increased. More particularly, reactive spacer 37a enhances a bulk diffusion of the deposited metal layer. The presence or absence of the reactive spacer determines the initial status of the deposited metal layer. Thus, deposition may be performed at a rate up to 1,000 Å/min in the presence of the reactive spacer.

Instead of Al-0.5%Cu, for preventing a Si precipitate formation in a subsequent heat-treating step, a composite layer as a first conductive layer 39 may be formed by depositing a first metal to form a first metal layer and a second metal to form a second metal layer in a vacuum at a low temperature in the same manner as above. The first metal is an aluminum alloy having a Si component such as Al—Si alloy (Al—1%Si) or Al—Cu—Si alloy (Al—0.5%Cu—1%Si) and the second metal is pure aluminum or an aluminum alloy having no Si component such as Al—Cu alloy (Al—0.5%Cu alloy) or Al—Ti alloy. The first metal and the second metal are deposited at a temperature below 150° C. by a sputtering method as above. When the wiring layer has a thickness of 6,000 Å, the first metal layer has a thickness not more than 1,500 Å and the second metal layer has a thickness not less than 2,500 Å. It is preferable that the first metal layer has a thickness of about 750 –1,500 Å and the second metal layer has a thickness of about 2,500–3,250 Å.

Figure 18:
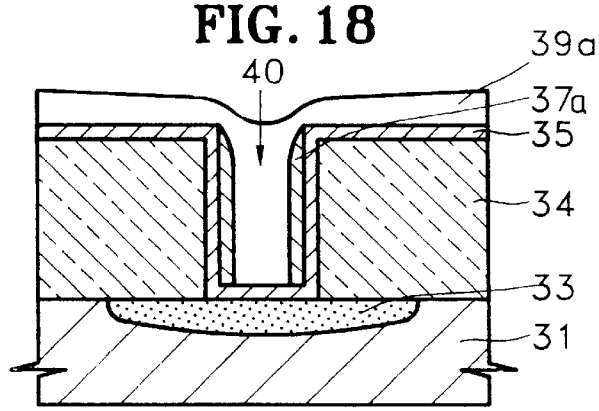

FIG. 18 illustrates a step of filling up contact hole 40 with a material of first conductive layer 39. More particularly, the semiconductor wafer is moved into another sputtering reaction chamber (not shown) without breaking the vacuum, wherein first conductive layer 39 is heat-treated using an argon conduction method, preferably at a temperature of about 500°–550° C. for about 1–5 minutes, thereby causing the atoms of aluminum or aluminum alloy to migrate into contact hole 40. The migration of the aluminum atoms causes surface free energy to be reduced, thereby decreasing surface area and facilitating the complete filling of contact hole 40 with the material of first conductive layer 39. Without reactive spacer 37a, contact hole 40 can be filled with the first conductive layer material as shown in FIG. 18 (as disclosed in U.S. Pat. Nos. 5,318,923, 5,355,020 and 5,266,521. However, after forming a diffusion barrier layer, a semiconductor wafer is usually exposed to the atmosphere. As a result, a very thin oxide layer is formed on the diffusion barrier layer to thereby inhibit the migration of the metal atoms of the first conductive layer during the heat-treating step. Particularly, when the oxide layer is formed on the sidewall of contact hole 40, the migration is remarkably reduced. Thus, all the contact holes of a semiconductor wafer are not completely filled with the first conductive layer material. Forming a reactive spacer 37a on the sidewall of contact hole 40 enhances the mobility of metal atoms which constitute first conductive layer 39, to thereby completely fill up all the contact holes of a semiconductor wafer with a metal of first conductive layer 39, by heat-treating.

When heat-treating first conductive layer 39 after forming a reactive spacer 37a comprised of Ti or TiN at a temperature above 500° C., the atoms of reactive spacer 37a react with the atoms of first conductive layer 39 to form, in the case of a Ti reactive spacer, titanium aluminide ($Al_3Ti$) or in the case of a TiN reactive spacer, titanium nitride and aluminum nitride (AlN). During the step of heat-treating, this reaction continues and the migration of atoms of the first conductive layer into contact hole 40 also continues to thereby fill up contact hole 40. Titanium aluminide has a higher melting point than Al, and ,therefore, its mobility is lower than Al. However, Al atoms formed on areas of diffusion barrier layer 35 other than contact hole 40 have a larger mobility than those in contact hole 40. This difference in atom mobility prevents a discontinuity of first conductive layer 39 during the heat-treating step, and therefore, results a continuous migration of atoms of the first conductive layer into contact hole 40. Thus, complete filling the opening with a material of first conductive layer 39 is accomplished.

When heat-treating first conductive layer 39 at a temperature above 500° C. after forming a reactive spacer 37a comprised of a metal which lowers the melting points of a material of first conductive layer 39 such as Ge, the atoms of reactive spacer 37a react with the atoms of first conductive layer 39 to form an alloy having a lower melting point than Al, such as Al-Ge alloy which has a eutectic point of 423° C. This remarkably improves the wettability between first conductive layer 39 and reactive spacer 37a and thus, the reflow of first conductive layer 39 is enhanced. Therefore, complete filling of contact hole 40 with a material of first conductive layer 39 is also accomplished.

When a metal having a Si component an a metal having no Si component are successively deposited to form a composite metal layer as a first conductive layer 39, a metal layer having no Si component absorbs Si atoms from the metal layer having a Si component, during the heat-treating step. Therefore, Si precipitates are not formed on the surface of the semiconductor substrate after forming the wiring pattern, and Al spiking is eliminated.

This heat-treatment step may be carried out in an inert gas (e.g., $N_2$, or Ar) atmosphere or a reductive gas (e.g., $H_2$) atmosphere. Instead of the above Argon conduction method, other heat-treating methods such as rapid thermal annealing (RTA), lamp heating, etc. can be used. These heat-treating methods may be used alone or in combination with others.

In FIG. 18, reference numeral 39a represents the first conductive layer which completely fills contact hole 40.

Figure 19:
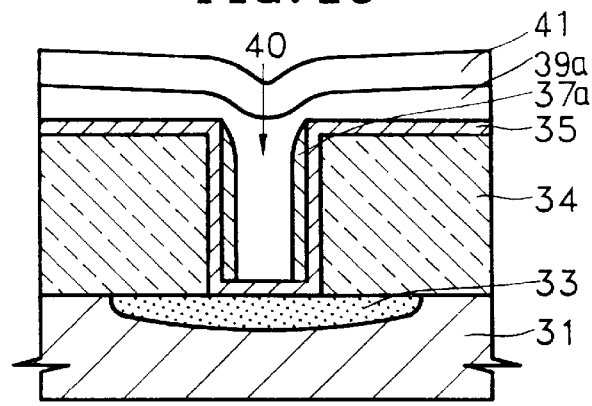

FIG. 19 illustrates a step of forming a second conductive layer 41 on first conductive layer 39a by heat-treatment as above. More particularly, second conductive layer 41 is formed by depositing a metal without breaking the vacuum at a temperature below 350° C. using a sputtering method to form a metal layer, so that the wiring layer has the required total thickness. When the required total thickness of the wiring layer is 6,000 Å second conductive layer 41 preferably has a thickness of about 2,000–4,000 Å. When first conductive layer 39a is comprised of a metal having no Si component such as Al-0.5%Cu alloy, second conductive layer 41 is preferably formed by depositing a metal having a Si component such as Al-1%Si-0.5%Cu. When a composite layer as first conductive layer 39 is formed as above, a metal having no Si component such as an Al—Cu alloy (Al-0.5%Cu) or Al—Ti alloy is preferably deposited to form second conductive layer 41. Here, the depositing of a metal for the second conductive layer is performed at a deposition rate higher than 100 Å/sec under Ar atmosphere below 10 mTorr. Also, a bias voltage of 200–400V may be applied to the substrate 31 during the second conductive layer depositing step.

Figure 20:
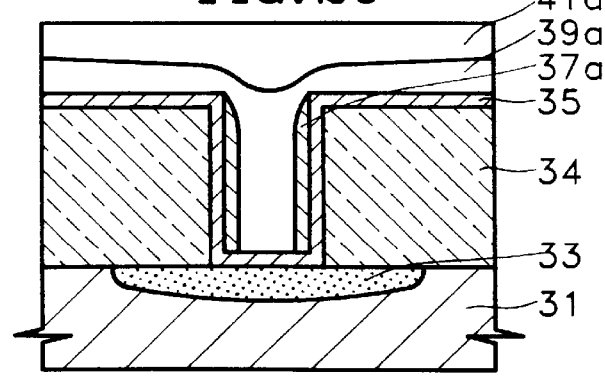

FIG. 20 illustrates a step of heat-treating second conductive layer 41, to thereby planarize the surface of the wiring layer. The reference numeral 41a represents the heat-treated second conductive layer. This step is carried out in the same manner as the first conductive layer, without breaking the vacuum. Performing this step enables the atoms of the metal layer to migrate into contact hole 40, thereby filling it more completely to result in a wholly planarized wiring layer. Thus, subsequent photolithography steps can be more easily and effectively carried out. However, this step is optional.

Thereafter, an anti-reflective layer (not shown in the drawings) is formed by depositing titanium nitride to a thickness of 200–500 Å on the surface of the heat-treated second conductive layer 41a, using a sputtering method. This improves the subsequent photolithography process.

After forming the anti-reflective layer, a predetermined resist pattern (not shown) for the wiring layer of a semiconductor device is formed on the anti-reflective layer by a conventional photolithography process, and then using the above resist pattern as an etching mask, anti-reflective layer, second conductive layer 41a, first conductive layer 39a and diffusion barrier layer 35 are subsequently etched to complete a wiring layer according to the present invention as shown in FIG. 7.

EMBODIMENT 2

FIGS. 21 to 27 illustrate a second embodiment of a method for forming a wiring layer according to the present invention.

Figure 21:
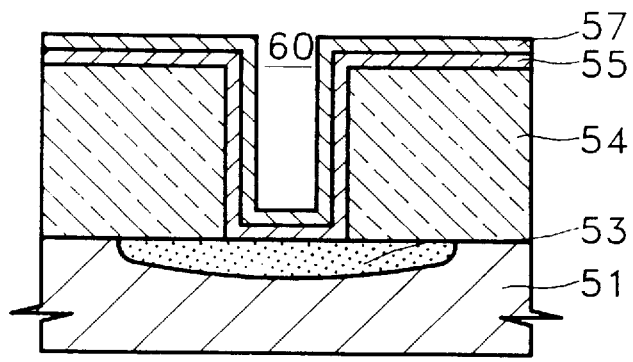
FIGS. 21 through 27 illustrate a second embodiment of a method forming a wiring layer according to the present invention.

FIG. 21 illustrates a step of forming a diffusion barrier layer 55 and a reactive material layer 56. More particularly, an 0.8–1.6 μm-thick insulating layer 54 having is formed on a semiconductor substrate 51 having an impurity-doped region 53 in a surface portion thereof. Then, insulating layer 54 is provided with a contact hole 60 as an opening formed on impurity-doped region 53.

Here, opening is a contact hole 60 being about 0.8 μm in size, and exposes a portion of the surface of semiconductor substrate 51 wherein an impurity-doped region 53 is formed. The aspect ratio (the ratio of the depth to the size) of the above contact hole 60 is about 1.0–2.0.

Next, diffusion barrier layer 55 composed of a Ti layer having a thickness of 300 Å and a TiN layer having a thickness of 1,000 Å is formed and heat-treated, and then a reactive material layer 57 having a thickness of 200 Å is formed, in the same manner as in Embodiment 1.

Figure 22:
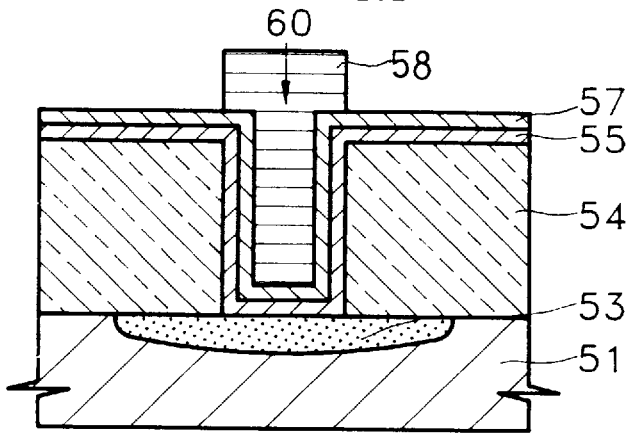

FIG. 22 illustrates a step of forming a photoresist pattern 58 for forming a reactive layer. After forming reactive material layer 57, a photoresist is coated to form a photoresist film on the whole surface of the resultant structure. Then, the obtained photoresist film is exposed to a light using a photomask having the reverse pattern to that for contact hole 60. The exposed photoresist film is developed to give photoresist pattern 58 for forming the reactive layer.

Figure 23:
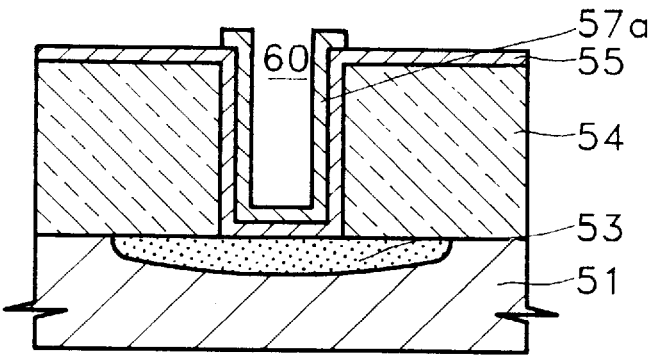

FIG. 23 illustrates a step of forming a reactive layer 57a on the sidewall of contact hole 60 and on the bottom surface portion of contact hole 60, that is, on diffusion barrier layer 55 in contact hole 60. After forming photoresist pattern 58, reactive material layer 57 is etched using photoresist pattern 58 as an etching mask, to thereby obtain reactive layer 57a formed on the sidewall of contact hole 60 and on the bottom surface portion of contact hole 60. Etching reactive material layer 57 may be performed by reactive ion etching (RIE) using $CF_4$ or wet etching using a $HCl+HNO_3+HF$ or $HNO_3+CH_3COOH+HF$ solution. Thereafter, photoresist pattern 58 is removed.

This embodiment shows that reactive layer 57a is formed by using the photolithography process as above. However, reactive layer 57a may be formed by an etch-back process. That is, reactive layer 57a may be formed by forming a photoresist layer on the reactive material layer 57 and then simultaneously etching back the photoresist layer and reactive material layer 57.

Figure 24:
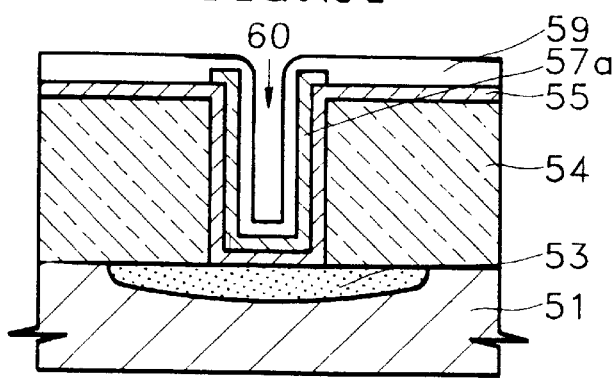

FIG. 24 illustrates a step of forming a first conductive layer 59. After forming reactive layer 57a, a first conductive layer 59 having a thickness of about 4,000 Å (given a wiring layer of a thickness of about 6,000 Å) is formed on diffusion barrier layer 55 and on reactive layer 57a by depositing a metal such as Al-0.5%Cu alloy in the same manner as in Embodiment 1.

Figure 25:
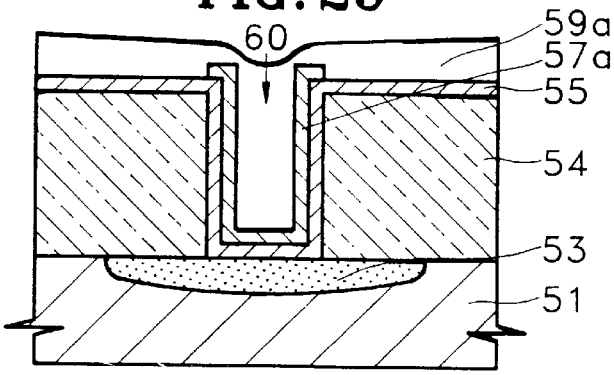

FIG. 25 illustrates a step of filling up contact hole 60 with a material of first conductive layer 59. The semiconductor wafer is moved into another sputtering reaction chamber without breaking the vacuum, wherein first conductive layer 59 is heat-treated to thereby completely fill up contact hole 60 with the first conductive layer material in the same manner as in Embodiment 1.

In FIG. 25, reference numeral 59a represents the first conductive layer which completely fills contact hole 60.

Figure 26:
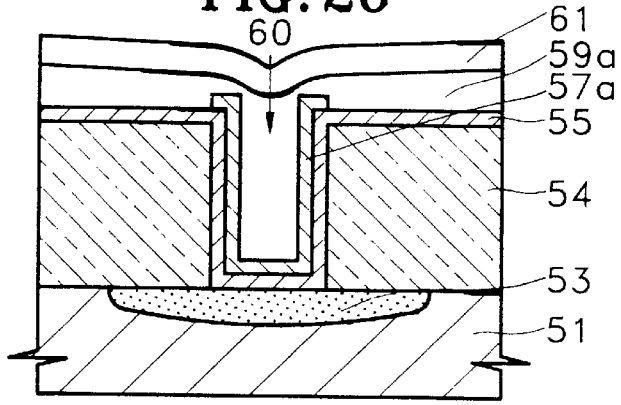

FIG. 26 illustrates a step of forming a second conductive layer 61 on first conductive layer 59a by heat-treatment as above. Second conductive layer 61 having a thickness of 2,000 Å (given a wiring layer of a thickness of 6,000 Å) is formed by depositing a metal without breaking the vacuum at a temperature below 350° C. using a sputtering method to form a metal layer, so that the wiring layer has the required total thickness in the same manner as in Embodiment 1.

Figure 27:
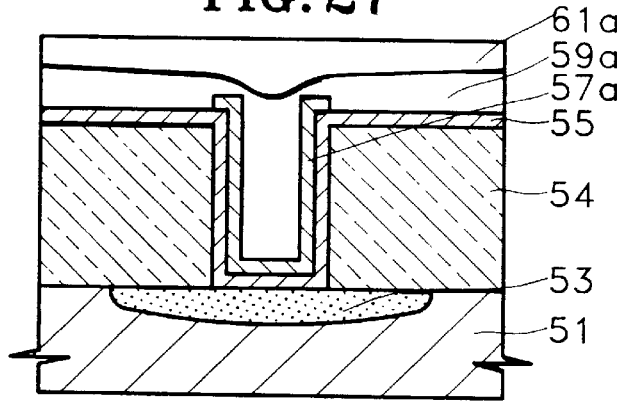

FIG. 27 illustrates a step of a heat-treating second conductive layer 61, to thereby planarize the surface of the wiring layer. The reference numeral 61a represents the heat-treated second conductive layer. This step is carried out in the same manner as the first conductive layer, without breaking the vacuum.

Thereafter, in the same manner as in Embodiment 1, an anti-reflective layer (not shown in the drawings) is formed on the heat-treated second conductive layer 61a, and then a predetermined resist pattern (not shown) for the wiring layer of a semiconductor device is formed on the anti-reflective layer by a conventional photolithography process. Thereafter, using the above resist pattern as an etching mask, the anti-reflective layer, second conductive layer 61a, first conductive layer 59a and diffusion barrier layer 55 are subsequently etched to complete a wiring layer according to the present invention as shown FIG. 8.

EMBODIMENT 3

Figure 28:
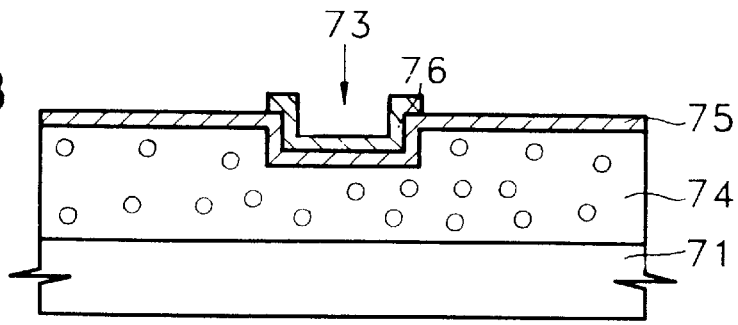
FIGS. 28 through 30 illustrate a third embodiment of a method for forming a wiring layer according to the present invention.
Figure 29:
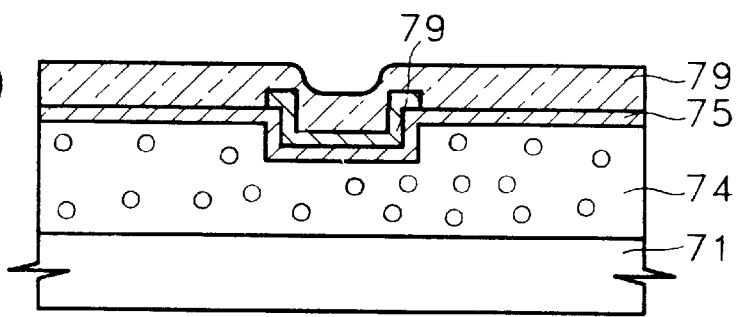
Figure 30:
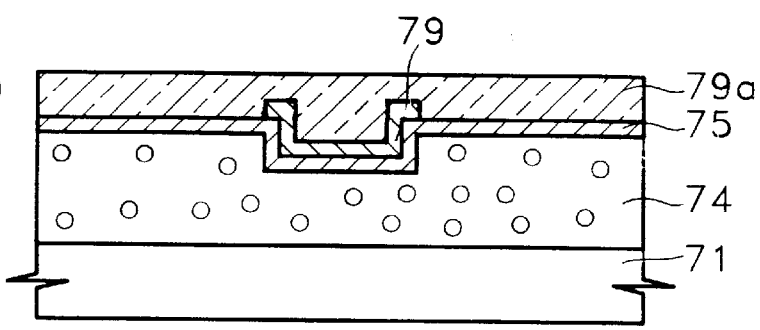

FIGS. 28 to 30 illustrate a third embodiment of a method for forming a wiring layer according to the present invention.

FIG. 28 illustrates a step of forming a diffusion barrier layer 75 and a reactive layer 76. More particularly, a 1.5 $\mu$m-thick insulating layer 74 is formed on a semiconductor substrate 71. Then, insulating layer 74 is provided with a groove 73 having a depth of 0.3 to 0.7 $\mu$m as a recessed portion via a conventional photolithography process, where a wiring layer is to be formed.

Next, a diffusion barrier layer 75 is formed and heat-treated in the same manner as in Embodiment 1 and then a reactive layer 76 having a thickness of 200 Å is formed on an inner surface of groove 73 by depositing a reactive material layer and then etching the portions of the reactive material layer other than groove 73, in the same manner as described in Embodiment 2.

FIG. 29 illustrates a step of forming a conductive layer 79. After forming reactive layer 76, a conductive layer 79 having a thickness of about 6,000 Å is formed on diffusion barrier layer 75 and reactive layer 76 by depositing a metal such as Al-0.5%Cu alloy in the same manner as in Embodiment 1.

FIG. 30 illustrates a step of heat-treating conductive layer 79. The semiconductor wafer is moved into another sputtering reaction chamber without breaking the vacuum, wherein first conductive layer 79 is heat-treated to thereby obtain a planarized conductive layer 79a in the same manner as in Embodiment 1.

In FIG. 30, reference numeral 79a represents the conductive layer having a planarized surface over groove 73.

The present embodiment shows a method for forming a wiring layer using a single conductive layer. However, it should be noted that a composite layer as in Embodiment 1 and 2 may be used in the present embodiment. Also, when the composite layer is used in the present invention, the second heat-treating step may be applied for further enhancing the reliability of the wiring layer.

Thereafter, in the same manner as in Embodiment 1, an anti-reflective layer (not shown in the drawings) is formed on the planarized conductive layer 79a, and then a predetermined resist pattern (not shown) for the wiring layer of a semiconductor device is formed on the anti-reflective layer by a conventional photolithography process, and then using the above resist pattern as an etching mask, the anti-reflective layer, planarized conductive layer 79a, and diffusion barrier layer 75 are subsequently etched to complete the wiring layer according to the present invention as shown in FIG. 9.

EMBODIMENT 4

Figure 31:
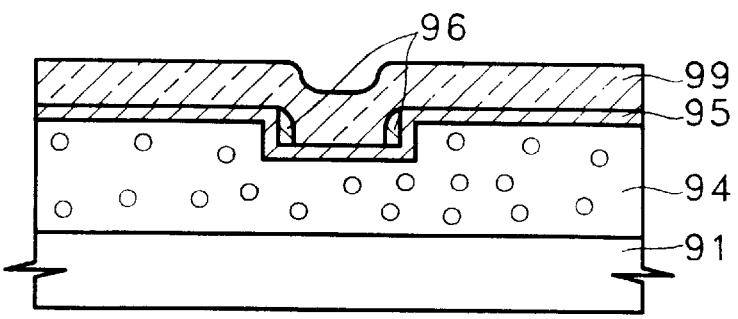
FIGS. 31 and 32 illustrate a fourth embodiment of a method for forming a wiring layer according to the present invention.
Figure 32:
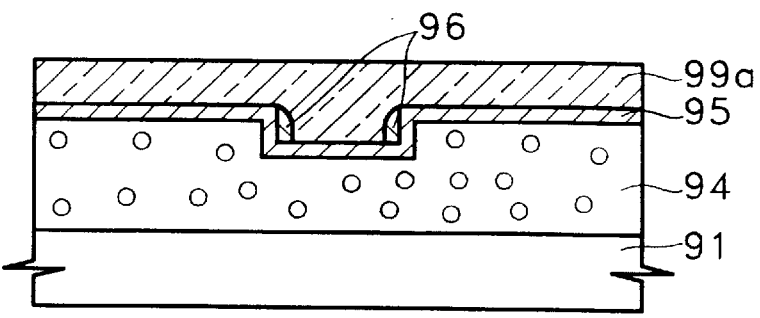

FIGS. 31 and 32 illustrate a fourth embodiment of a method for forming a wiring layer according to the present invention.

FIG. 31 illustrates a step of forming a diffusion barrier layer 95, a reactive spacer 96 and a conductive layer 97. More particularly, after a 1.5 $\mu$m-thick insulating layer 94 is formed on a semiconductor substrate 91, insulating layer 94 is provided with a groove having a depth of 0.3 to 0.7 $\mu$m as a recessed portion via a conventional photolithography process, where a wiring layer is to be formed as in Embodiment 3.

Next, a diffusion barrier layer 95 is formed and heat-treated, and then a reactive spacer 96 is formed on the sidewall of the groove by depositing a reactive material layer and then anisotropically etching the reactive material layer, in a same manner as in Embodiment 1.

Thereafter, a conductive layer 99 having a thickness of about 6,000 Å is formed on diffusion barrier layer 95 and reactive spacer 96 by depositing a metal such as Al-0.5%Cu alloy in the same manner as in Embodiment 1.

FIG. 32 illustrates a step of heat-treating conductive layer 99. In the same manner as in embodiment 3, the semiconductor wafer is moved into another sputtering reaction chamber without breaking the vacuum, wherein conductive layer 99 is heat-treated to thereby obtain a planarized conductive layer 99a.

Thereafter, in the same manner as in Embodiment 1, an anti-reflective layer (not shown in the drawings) is formed on the planarized conductive layer 99a, and then a predetermined resist pattern (not shown) for the wiring layer of a semiconductor device is formed on the anti-reflective layer by a conventional photolithography process, and then using the above resist pattern as an etching mask, the anti-reflective layer, planarized conductive layer 99a, and diffusion barrier layer 95 are subsequently etched to complete the wiring layer according to the present invention as shown in FIG. 10.

EMBODIMENT 5

Referring to FIG. 11, a fifth embodiment of the present invention will be described.

On a semiconductor substrate 101 having an impurity doped region 102, an insulating layer 103 having a contact hole which exposes a portion of impurity doped region 102 and connects a lower wiring layer to impurity doped region 102 is formed. Then, after forming a first diffusion layer 105 on the inner surface of the contact hole (that is, on the sidewall of the contact hole and on an exposed surface of semiconductor substrate 101) and insulating layer 103, a conductive layer is formed on first diffusion layer 105 which completely fills the contact hole and is electrically connected to impurity doped region 102. Thereafter, an anti-reflexive layer 107 is formed on the conductive layer, and patterning is performed to complete lower wiring layer 106. Up to this step, lower wiring layer 106 may be completed according to the method of the present invention or according to a conventional method.

After completing lower wiring layer 106, an insulating interlayer 108 having a thickness of 0.8 to 1.5 $\mu$m is coated to cover the lower wiring layer 106, and then a via which connects an upper wiring layer to lower wiring layer 106 is formed in insulating interlayer 108 so that its size is smaller than 1.0×1.0 $\mu$m. Thereafter, a second diffusion barrier layer 110 formed on insulating interlayer 108, the inner surface of the via and an exposed surface of lower wiring layer 106 in the same manner as in Embodiment 1. Then, a reactive spacer 111a and a conductive layer are formed as described in FIGS. 15 to 17 or FIG. 31.

After heat-treating the conductive layer and then forming an anti-reflective layer (not shown in the drawings), the heat-treated conductive layer is patterned to complete an upper wiring layer 112 of a semiconductor device according to the present invention, in the same manner as in Embodiment 1.

In this Embodiment, the heat-treating step of the conductive layer may be omitted, if unnecessary. FIG. 11 illustrates the upper wiring layer 112 which has been formed without heat-treating.

EMBODIMENT 6

Referring to FIG. 12, a sixth embodiment of the present invention will be described.

An upper wiring layer 112 of FIG. 12 is obtained in the same manner as in Embodiment 5 except that a reactive layer 111b is formed as described in Embodiment 2 concerning FIGS. 21 to 23 in place of reactive spacer 111a.

Tests concerning the degree of the contact hole filling and reflectivity of the wiring layer have been carried out on wiring layers formed in accordance with the above Embodiments 1 and 2. Equivalent tests have been conducted respectively for the wiring layer according to the method with neither a reactive spacer nor a reactive layer as described in U.S. Pat. No. 521,318,923. Each of these tests was performed on ten thousand 0.8 μm contact holes having an aspect ratio of 1.5 and the filling of the contact hole and the reflectivity of the wiring layer have been investigated after the first heat-treating step of the first conductive layer. The results are shown in Table 1 below.

TABLE 1

| reactive spacer/ layer material filler | reflectivity | degree of contact hole filler |
|---|---|---|
| none | 50% | 210–220 |
| TiN | 100% | 210–220 |
| Ti | 100% | 210–220 |
| Ge | 100% | 210–220 |

As can be seen from Table 1, providing a reactive spacer or layer according to the present invention, improves the filling of contact holes having high aspect ratios greater than one. This improves the reliability of the contact hole or a via of a multi-level interconnection of a semiconductor device, and improves the electromigration and stressmigration resistance of a wiring layer of a semiconductor device as well. Also, since the reactive spacer or layer reacts with a metal layer (the first conductive layer of the present invention) only in the contact hole, and since there is no reaction between the metal layer and the reactive spacer or layer other than in the contact hole, the reflectivity of the metal layer as the first conductive layer is the same as that the prior method. Therefore, no problem occurs other portion than the contact hole.

It will be apparent that many modifications and variations could be effected easily by one skilled in the art without departing from the spirit or scope of the novel concepts of the present invention.

What is claimed is:

1. A semiconductor device including a wiring layer comprising:
   a semiconductor substrate;
   an insulating layer having a recessed portion formed on said semiconductor substrate;
   a reactive spacer formed on a sidewall of said recessed portion;
   a first conductive layer formed on recessed portion and on said reactive spacer, said first conductive layer completely filling said recessed portion and having a planarized surface; and
   wherein said reactive spacer includes a material which reacts with said first conductive layer so as to lower the melting point of a material of said first conductive layer.

2. A semiconductor device as claimed in claim 1, wherein said material of said reactive spacer includes at least one material one material selected from the group consisting of Ge, Mg, Sn, In, Pb and Zn.

3. A semiconductor device as claimed in claim 1, further comprising a second conductive layer formed on said first conductive layer.

4. A semiconductor device as claimed in claim 3, wherein said second conductive layer comprises a metal having no Si component.

5. A semiconductor device including a wiring layer comprising:
   a semiconductor substrate;
   an insulating layer having a recessed portion formed on said semiconductor substrate;
   a reactive layer formed on an inner surface of said recessed portion;
   a first conductive layer formed on said reactive layer, said first conductive layer completely filling said recessed portion and having a planarized surface; and
   wherein said reactive layer includes a material which reacts with said first conductive layer so as to lower the melting point of a material of said first conductive layer.

6. A semiconductor device as claimed in claim 5, wherein said material of said reactive layer includes at least one material selected from a group consisting of Ge, Mg, Sn, In, Pb and Zn.

7. A semiconductor device as claimed in claim 5, further comprising a second conductive layer formed on said first conductive layer.

8. A semiconductor device as claimed in claim 7, wherein said second conductive layer comprises a metal having no Si component.

9. A semiconductor device comprising:
   a reactive spacer formed on a sidewall of a recessed portion;
   wherein said reactive spacer includes a material which improves step coverage of a first conductive layer in a depositing step and enhances reflow of a material of said first conductive layer in a step of reflowing of said material of said first conductive layer by heat-treating said first conductive layer, after forming said first conductive layer, and which lowers the melting point of said material of said conductive layer.

10. A semiconductor device as claimed in claim 9, wherein said material of said reactive spacer includes at least one material selected from the group consisting of Ge, Mg, Sn, In, Pb and Zn.

11. A semiconductor device as claimed in claim 9, further comprising a second conductive layer formed on said first conductive layer.

12. A semiconductor device as claimed in claim 11, wherein said second conductive layer comprises a metal having no Si component.

13. A semiconductor device comprising:
   a reactive layer formed on an inner surface of a recessed portion;
   wherein said reactive layer includes a material which improves step coverage of a first conductive layer in a depositing step and enhances reflow of a material of said first conductive layer in a step of reflowing of said material of said first conductive layer by heat-treating said first conductive layer, after said first conductive layer, and which lowers the melting point of said material of said conductive layer.

14. A semiconductor device as claimed in claim 13, wherein said material of said reactive layer includes at least one material selected from a group consisting of Ge, Mg, Sn, In, Pb and Zn.

15. A semiconductor device as claimed in claim 13, further comprising a second conductive layer on said first conductive layer.

16. A semiconductor device as claimed in claim 15, wherein said second conductive layer comprises a metal having no Si component.

17. A semiconductor device including a wiring layer comprising:
   a semiconductor substrate;
   an insulating layer having a recessed portion formed on said semiconductor substrate;
   a reactive spacer formed on a sidewall of said recessed portion;
   a first conductive layer formed on recessed portion and on said reactive spacer, said first conductive layer completely filling said recessed portion and having a planarized surface; and
   wherein said reactive spacer includes a means for lowering the melting point of a material of said first conductive layer.

18. A semiconductor device as claimed in claim 17, wherein said means for lowering the melting point comprises a material which includes at least one material selected from the group consisting of Ge, Mg, Sn, In, Pb and Zn.

19. A semiconductor device as claimed in claim 17, further comprising a second conductive layer formed on said first conductive layer.

20. A semiconductor device as claimed in claim 19, wherein said second conductive layer comprises a metal having no Si component.

21. A semiconductor device including a wiring layer comprising:
   a semiconductor substrate;
   an insulating layer having a recessed portion formed on said semiconductor substrate;
   a reactive layer formed on an inner surface of said recessed portion;
   a first conductive layer formed on said reactive layer, said first conductive layer completely filling said recessed portion and having a planarized surface; and
   wherein said reactive layer includes a means of lowering the melting point of a material of said first conductive layer.

22. A semiconductor device as claimed in claim 21, wherein said means for lowering the melting point comprises a material which includes at least one material selected from the group consisting of Ge, Mg, Sn, In, Pb and Zn.

23. A semiconductor device as claimed in claim 21, further comprising a second conductive layer formed on said first conductive layer.

24. A semiconductor device as claimed in claim 23, wherein said second conductive layer comprises a metal having no Si component.

25. A semiconductor device including a wiring layer comprising:
   a semiconductor substrate;
   an insulating layer having a recessed portion formed on said semiconductor substrate;
   a spacer formed on a sidewall of said recessed portion;
   a first conductive layer formed on said recessed portion and on said spacer, said first conductive layer completely filling said recessed portion and having a planarized surface, said first conductive layer comprising a first metal layer having an Si component and a second metal layer having no Si component; and
   a second conductive layer, said second conductive layer being different from said first conductive layer, formed over said first conductive layer.

26. A semiconductor device as claimed in claim 25, wherein said semiconductor device further comprises a diffusion barrier layer, said diffusion barrier being different than said first conductive layer, formed over said insulating layer, and under said first conductive layer.

27. A semiconductor device as claimed in claim 25, wherein said second conductive layer has a planarized surface over said recess.

28. A semiconductor device as claimed in claim 26, wherein said diffusion barrier layer comprises at least one material selected from a group consisting of transition metals and transition metal compounds.

29. A semiconductor device as claimed in claim 27, wherein said second conductive layer comprises a metal having no Si component.

30. A semiconductor device including a wiring layer comprising:
   a semiconductor substrate;
   an insulating layer having a recessed portion formed on said semiconductor substrate;
   a spacer formed on a sidewall of said recessed portion;
   a first conductive layer formed on said recessed portion and on said spacer, said first conductive layer completely filling said recessed portion and having a planarized surface, said first conductive layer comprising a first metal layer having an Si component and a second metal layer having no Si component; and
   a second conductive layer, said second conductive layer being different from said first conductive layer, formed over said first conductive layer;
   wherein said first conductive layer contains substantially 1.0 percent by weight of an Si component.

31. A semiconductor device including a wiring layer comprising:
   a semiconductor substrate;
   an insulating layer having a recessed portion formed on said semiconductor substrate;
   a spacer formed on a sidewall of said recessed portion;
   a first conductive layer formed on said recessed portion and on said spacer, said first conductive layer completely filling said recessed portion and having a planarized surface, said first conductive layer comprising a first metal layer having an Si component and a second metal layer having no Si component; and
   a second conductive layer, said second conductive layer being different from said first conductive layer, formed over said first conductive layer;
   wherein said semiconductor device further comprises a diffusion barrier layer formed over said insulating layer, and under said first conductive layer;

said diffusion barrier layer comprises at least one material selected from a group consisting of transition metals and transition metal compounds;

said diffusion barrier layer comprises a first diffusion barrier sub-layer composed of a transition metal, and a second diffusion barrier sub-layer composed of a transition metal compound.

32. A semiconductor device including a wiring layer comprising:

a semiconductor substrate;

an insulating layer having a recessed portion formed on said semiconductor substrate;

a spacer formed on an inner surface of said recessed portion;

a first conductive layer formed on said spacer, said first conductive layer completely filling said recessed portion and having a planarized surface, said first conductive layer comprising a first metal layer having a Si component and a second metal layer having no Si component; and a second conductive layer, said second conductive layer being different from said first conductive layer, formed over said first conductive layer.

33. A semiconductor device as claimed in claim 32, wherein said semiconductor device further comprises a diffusion barrier, said diffusion barrier being different from said first conductive layer formed over said insulating layer.

34. A semiconductor device as claimed in claim 32, wherein said second conductive layer has a planarized surface over said recess.

35. A semiconductor device as claimed in claim 33, wherein said diffusion barrier layer comprises at least one material selected from a group consisting of transition metals and transition metal compounds.

36. A semiconductor device as claimed in claim 34, wherein said second conductive layer comprises a metal having no Si component.

37. A semiconductor device including a wiring layer comprising:

a semiconductor substrate;

an insulating layer having a recessed portion formed on said semiconductor substrate;

a spacer formed on an inner surface of said recessed portion;

a first conductive layer formed on said spacer, said first conductive layer completely filling said recessed portion and having a planarized surface, said first conductive layer comprising a first metal layer having a Si component and a second metal layer having no Si component; and a second conductive layer, said second conductive layer being different from said first conductive layer, formed over said first conductive layer;

wherein said first conductive layer contains substantially 1.0 percent by weight of an Si component.

38. A semiconductor device including a wiring layer comprising:

a semiconductor substrate;

an insulating layer having a recessed portion formed on said semiconductor substrate;

a spacer formed on an inner surface of said recessed portion;

a first conductive layer formed on said spacer, said first conductive layer completely filling said recessed portion and having a planarized surface, said first conductive layer comprising a first metal layer having a Si component and a second metal layer having no Si component; and a second conductive layer, said second conductive layer being different from said first conductive layer, formed over said first conductive layer;

wherein said semiconductor device further comprises a diffusion barrier formed over said insulating layer;

said diffusion barrier layer comprises at least one material selected from a group consisting of transition metals and transition metal compounds; and said diffusion barrier layer comprises a first diffusion barrier sub-layer composed of a transition metal, and a second diffusion barrier sub-layer composed of a transition metal compound.

* * * * *